(12) United States Patent
Sakato et al.

(10) Patent No.: US 7,799,580 B2
(45) Date of Patent: Sep. 21, 2010

(54) METHOD FOR MANUFACTURING FERROELECTRIC MEMORY DEVICE

(75) Inventors: Osamu Sakato, Okaya (JP); Takeshi Kokubun, Suwa (JP)

(73) Assignee: Seiko Epson Corporation (JP)

( * ) Notice: Subject to any disclaimer, the term of this patent is extended or adjusted under 35 U.S.C. 154(b) by 149 days.

(21) Appl. No.: 12/172,430

(22) Filed: Jul. 14, 2008

(65) Prior Publication Data
US 2009/0075399 A1    Mar. 19, 2009

(30) Foreign Application Priority Data
Sep. 14, 2007    (JP) .............................. 2007-239443

(51) Int. Cl.
*H01L 21/00* (2006.01)
(52) U.S. Cl. ........................ 438/3; 438/474; 438/475; 257/E21.17; 257/E21.006; 257/E21.077; 257/E21.245; 257/E21.304; 257/E21.497; 257/E21.646; 257/E21.647
(58) Field of Classification Search ............ 438/3, 438/474, 475, 513, 509, 680, 692, 700, 675, 438/683, 684, 685, 688, 706; 257/E21.17, 257/304, 6, 77, 245, 497, 646, 647
See application file for complete search history.

(56) References Cited

U.S. PATENT DOCUMENTS

| 6,066,868 A | * | 5/2000 | Evans, Jr. ................... 257/295 |
|---|---|---|---|
| 6,485,988 B2 | | 11/2002 | Ma et al. |
| 6,951,788 B2 | | 10/2005 | Ohyagi |
| 7,075,134 B2 | * | 7/2006 | Paz de Araujo et al. ..... 257/295 |
| 7,235,834 B2 | * | 6/2007 | Fukada ....................... 257/295 |
| 7,297,999 B1 | * | 11/2007 | Wang et al. ................. 257/296 |
| 2007/0148787 A1 | | 6/2007 | Kiuchi et al. |

FOREIGN PATENT DOCUMENTS

| JP | 2001-230382 | 8/2001 |
|---|---|---|
| JP | 2002-083798 | 3/2002 |
| JP | 2002-190581 | 7/2002 |
| JP | 2003-332536 | 11/2003 |
| JP | 2006-108268 | 4/2006 |
| JP | 2007-027532 | 2/2007 |
| JP | 2007-180311 | 7/2007 |

* cited by examiner

*Primary Examiner*—David Nhu
(74) *Attorney, Agent, or Firm*—Harness, Dickey & Pierce, P.L.C.

(57) ABSTRACT

A method for manufacturing a ferroelectric memory device includes the steps of: forming a ferroelectric capacitor on a substrate; forming a hydrogen barrier film that covers the ferroelectric capacitor; forming a dielectric film that covers the hydrogen barrier film; and forming a through hole that penetrates the dielectric film and the hydrogen barrier film by etching that uses a mixed gas containing perfluorocarbon gas and oxygen gas, wherein the flow quantity of the perfluorocarbon gas is 0.77 times or more but 3.8 times or less the flow quantity of the oxygen gas.

3 Claims, 2 Drawing Sheets

METHOD FOR MANUFACTURING FERROELECTRIC MEMORY DEVICE

The entire disclosure of Japanese Patent Application No. 2007-239443, filed Sep. 14, 2007 is expressly incorporated by reference herein.

BACKGROUND

1. Technical Field

The present invention relates to methods for manufacturing ferroelectric memory devices having ferroelectric capacitors.

2. Related Art

Ferroelectric memory devices (FeRAM) are nonvolatile memory devices capable of low voltage and high-speed operation, using spontaneous polarization of ferroelectric material, and their memory cells can be each formed from one transistor and one capacitor (1T/1C). Accordingly, ferroelectric memory devices can achieve integration at the same level of that of DRAM, and are therefore expected as large-capacity nonvolatile memories. As the ferroelectric material, perovskite type oxides such as lead zirconate titanate (Pb (Zi, Ti) $O_3$: PZT), and bismuth layered compounds such as strontium bismuth tantalate ($SrBi_2TaO_9$: SBT) can be enumerated.

A hydrogen barrier film that prevents reducing elements such as hydrogen from penetrating from outside is provided around a ferroelectric capacitor composing a ferroelectric memory device. The hydrogen barrier film prevents generation of oxygen deficiency in the ferroelectric material thereby preventing deterioration of electrical characteristics of the ferroelectric capacitor. Also, the ferroelectric capacitor is conductively connected to a wiring formed on an interlayer dielectric film covering the hydrogen barrier film through a plug formed in a contact hole that penetrates the hydrogen barrier film and interlayer dielectric film. For example, Japanese Laid-open Patent Application JP-A-2006-108269 is an example of related art.

The contact hole is formed, using a dry etching method. When the contact hole is formed in the interlayer dielectric film, a mixed gas containing, for example, $CHF_3$ gas, $CF_4$ gas and Ar gas may be used as an etching gas. When the contact hole is formed in the hydrogen barrier film, a mixed gas containing, for example, $BCl_3$ gas and $Cl_2$ gas as an etching gas.

However, the method for forming a ferroelectric memory device of related art entails the following problems. In the etching that uses the mixed gas containing $BCl_3$ gas and $Cl_2$ gas, a sufficient selection ratio cannot be obtained because the etching rate of an Ir film formed as a base layer of the hydrogen barrier film is high, which may lead to a problem of excessive cutting of the Ir film by over-etching.

SUMMARY

In accordance with an advantage of some aspects of the invention, it is possible to provide a method for manufacturing a ferroelectric memory device in which a sufficient selection ratio can be obtained in etching between a hydrogen barrier film and its base layer, and a process of forming contact holes is simplified.

In accordance with an embodiment of the invention, a method for manufacturing a ferroelectric memory device includes the steps of: forming a ferroelectric capacitor on a substrate; forming a hydrogen barrier film that covers the ferroelectric capacitor; forming a dielectric film that covers the hydrogen barrier film; and forming a through hole that penetrates the dielectric film and the hydrogen barrier film by etching that uses a mixed gas containing perfluorocarbon gas and oxygen gas, wherein the flow quantity of the perfluorocarbon gas is 0.77 times or more but 3.8 times or less the flow quantity of the oxygen gas.

In accordance with the present embodiment, perfluorocarbon gas that does not contain hydrogen as its constituent element which is a reducing element to ferroelectric material is used, and the flow quantity of perfluorocarbon gas is set to 0.77 times or more but 3.8 times or less the flow quantity of oxygen gas. As a result, the dielectric film and the hydrogen barrier film can be etched at sufficient rates, respectively, and a sufficient selection ratio can be obtained in etching between the hydrogen barrier film and its base layer. Also, the etching gas does not have to be changed between etching the dielectric film and etching the hydrogen barrier film, such that the manufacturing process can be simplified. More specifically, by setting the flow quantity of perfluorocarbon gas to 0.77 times or more the flow quantity of oxygen gas, polymers that are generated when a resist layer that is used as a mask at the time of forming the through hole is exposed to plasmas can be prevented from being deposited, and the interlayer dielectric film and the hydrogen barrier film can be stably etched, respectively. Also, by setting the flow quantity of perfluorocarbon gas to 3.8 times or less the flow quantity of oxygen gas, the interlayer dielectric film can be etched at a stable rate, and a reduction in the processing accuracy of the through hole due to excessive cutting of the resist layer in etching can be prevented. Moreover, by using perfluorocarbon gas that does not contain hydrogen as its constituent element that acts as a reducing element to the ferroelectric material, generation of oxygen deficiency in the ferroelectric material can be prevented at the time of etching the hydrogen barrier film.

In the method for manufacturing a ferroelectric memory device in accordance with an aspect of the embodiment of the invention, the flow quantity of oxygen gas may preferably be 2 sccm or more but 10 sccm or less.

In accordance with the embodiment described above, the flow quantity of oxygen gas is set between 2 sccm and 10 sccm, whereby formation of an etching stopper layer and lowering of the processing accuracy in forming the through hole can be prevented.

In the method for manufacturing a ferroelectric memory device in accordance with an aspect of the embodiment of the invention, the mixed gas may preferably include carbon monoxide gas.

In accordance with the embodiment described above, a resist layer that is used as a mask at the time of forming the through hole becomes more difficult to be etched. By this, the processing accuracy of the through hole can be maintained.

DESCRIPTION OF EXEMPLARY EMBODIMENTS

Figure 1:
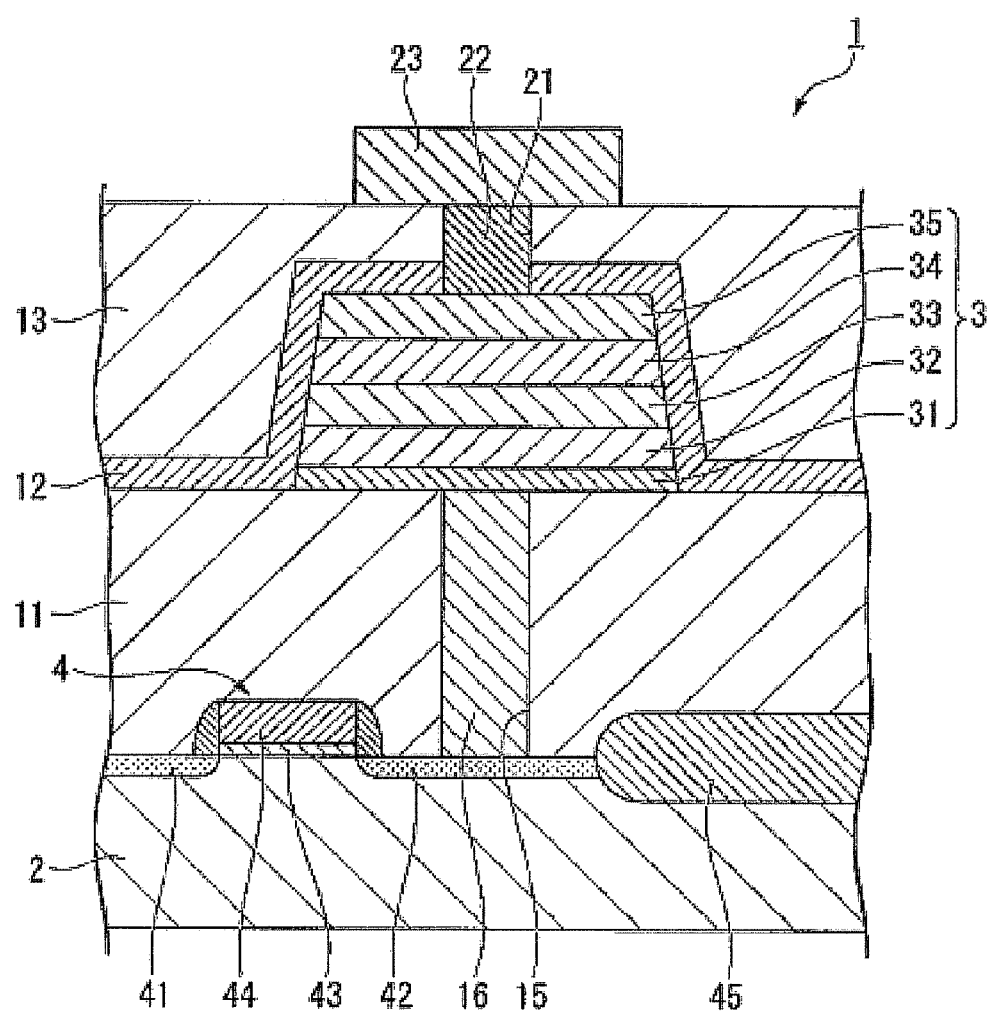
FIG. 1 is a schematic cross-sectional view of a ferroelectric memory device manufactured by a manufacturing method in accordance with an embodiment of the invention.

A method for manufacturing a ferroelectric memory device in accordance with a preferred embodiment of the invention is described below with reference to the accompanying drawings. It is noted that the scale of each of the members differs from one another in each of the figures used for the description made below such that each of the members has a recognizable size. FIG. 1 is an enlarged schematic cross-sectional view of a ferroelectric memory device manufactured by a method for manufacturing a ferroelectric memory device in accordance with an embodiment of the invention, and FIGS. 2A-2D are views showing steps of a method for manufacturing a ferroelectric memory device.

Ferroelectric Memory Device

First, a ferroelectric memory device manufactured by a method for manufacturing a ferroelectric memory device in accordance with an embodiment of the invention is described with reference to FIG. 1.

A ferroelectric memory device 1 is in a stacked type having a one transistor/one capacitor (1T/1C) type memory cell structure, and is equipped with a semiconductor substrate (substrate) 2, and a ferroelectric capacitor 3 and a transistor 4 formed over the semiconductor substrate 2, as shown in FIG. 1.

The semiconductor substrate 2 is comprised of, for example, silicon (Si), and a first interlayer dielectric film 11, a hydrogen barrier film 12 and a second interlayer dielectric film (insulation film) 13 are successively laminated on a top surface of the semiconductor substrate 2. The first interlayer dielectric film 11 may be comprised of, for example, silicon oxide ($SiO_2$), and covers the transistor 4 formed on the semiconductor substrate 2. A through hole 15 is formed in the first interlayer dielectric film 11 above a drain region 42 to be described below, and a plug 16 is filled in the through hole 15. The plug 16 is comprised of a conductive material that fills the through hole 15, and may be formed from, for example, W (tungsten), Mo (molybdenum), Ta (tantalum), Ti (titanium), Ni (nickel) or the like.

The hydrogen barrier film 12 may be formed from, for example, alumina (AlOx). The hydrogen barrier film 12 covers the top surface and side surface of the ferroelectric capacitor 3 formed on the first interlayer dielectric film 11.

The second interlayer dielectric film 13 is formed from, for example, $SiO_2$, like the first interlayer dielectric film 11, as shown FIG. 1. The second interlayer dielectric film 13 covers the hydrogen barrier film 12. Also, a through hole 21 is formed in the second interlayer dielectric film 13 and the hydrogen barrier film 12.

It is noted that, on a top surface of the second interlayer dielectric film 13, an inner wall surface of the through hole 21 and an area of the top surface of the ferroelectric capacitor 3 that is exposed through the through hole 21, an adhesion layer (not shown) for improving the adhesion with a plug 22 may be formed. The adhesion layer may be formed from a material having a hydrogen barrier property, such as, for example, TiN, TiAlN, or a laminated film of the aforementioned materials.

The plug 22 is formed from, for example, W, Mo, Ta, Ti or Ni. Also, a wiring 23 that is conductively connected to the plug 22 is formed on the second interlayer dielectric film 13. The wiring 23 may be formed from a conductive material, such as, for example, Al. It is noted that a reflection prevention film (not shown) is formed on the surface of the wiring 23.

The ferroelectric capacitor 3 is formed on the first interlayer dielectric film 11 and the plug 16, and has a structure in which a conductive film 31, an oxygen barrier film 32, a lower electrode 33, a ferroelectric film 34 and an upper electrode 35 are successively laminated in this order from the bottom layer.

The conductive film 31 is comprised of a conductive material, such as, for example, TiN or the like, and functions to conductively connect the plug 16 with the ferroelectric capacitor 3.

The oxygen barrier film 32 is formed from a material having oxygen barrier property, such as, for example, TiAlN, TiAl, TiSiN, TiN, TaN, TaSiN or the like.

The lower electrode 33 is comprised of at least one of, for example, Ir (iridium), Pt (platinum), Ru (ruthenium), Rh (rhodium), Pd (palladium) and Os (osmium), an alloy thereof, or an oxide thereof. The lower electrode 33 may preferably be comprised of Ir or Pt, and more preferably be comprised of Ir. It is noted that the lower electrode 33 may be in a single layer film or a multilayer film of laminated layers.

When the lower electrode 33 is crystalline, the crystal orientation of the lower electrode 33 and the crystal orientation of the oxygen barrier layer 32 may preferably be in an epitaxial orientation relation at an interface between them, as shown in FIG. 1. In this case, the crystal orientation of the lower electrode 33 and the crystal orientation of the ferroelectric film 34 may also preferably be in an epitaxial orientation relation at an interface between them.

For example, when the oxygen barrier film 32 belongs to the cubic crystal system, and its crystal orientation is in a (111) orientation, or when the oxygen barrier film 32 belongs to a hexagonal crystal system, and its crystal orientation is in a (001) orientation, the crystal orientation of the lower electrode 33 may preferably be in a (111) orientation. With this structure, when the ferroelectric film 34 is formed on the lower electrode 33, the crystal orientation of the ferroelectric film 34 can be readily made along a (111) orientation.

The ferroelectric film 34 is formed from a ferroelectric material having a perovskite crystal structure that is expressed by a general formula $A_{1-b}B_{1-a}X_aO_3$. The element A in the general formula includes Pb, and a part of Pb may be replaced with La. The element B is comprised of at least one of Zr (zirconium) and Ti. The element X may be comprised of at least one of V (vanadium), Nb (niobium), Ta, Cr (chrome), Mo, W, Ca (calcium), Sr (strontium) and Mg (magnesium). As a ferroelectric material composing the ferroelectric film 34, a known material, such as, for example, PZT, SBT, and $(Bi, La)_4Ti_3O_{12}$ (bismuth lanthanum titanate: BLT) can be used. Above all, PZT is suitable.

When PZT is used as the ferroelectric material, Ir may preferably be used as the material for the lower electrode 33 from the viewpoint of reliability of the ferroelectric capacitor 3. When PZT is used as the ferroelectric material, the content of Ti in the PZT may preferably be greater than the content of Zr in order to obtain a greater amount of spontaneous polarization. Moreover, when the ferroelectric film 34 is comprised of PZT, and the content of Ti in the PZT is greater than the content of Zr therein, the crystal orientation of the PZT may preferably be in a (111) orientation, because the hysteresis characteristic of the PZT is excellent in this orientation.

The upper electrode 35 may be comprised of any of the materials described above used for the lower electrode 33, or may be comprised of Al, Ag (silver), Ni or the like. Also, the upper electrode 35 may be in a single layer film, or a multilayer film of laminated layers. The upper electrode 35 may preferably be comprised of Pt or a laminated film of layers of IrOx and Ir.

The transistor 4 is equipped with a source region 41, a drain region 42 and a channel region (not shown) formed in a surface layer of the semiconductor substrate 2, a gate dielectric film 43 formed on the channel region, and a gate electrode 44 formed on the gate dielectric film 43. The transistor 4 is conductively connected to the plug 16 formed on the drain region 42. Also, transistors 4 are formed in plurality, spaced from one another in the semiconductor substrate 2, and mutually insulated by element isolation regions 45 provided between adjacent ones of the transistors 4.

Method For Manufacturing Ferroelectric Memory Device

Next, a method for manufacturing the above-described ferroelectric memory device 1 is described with reference to FIGS. 2A-2D.

First, a transistor 4 is formed in a semiconductor substrate 2, and a first interlayer dielectric film 11 that covers the transistor 4 is also formed. Then, a through hole 15 that penetrates the first interlayer dielectric film 11 is formed, and the through hole 15 is filled with a plug 16.

Figure 2A:
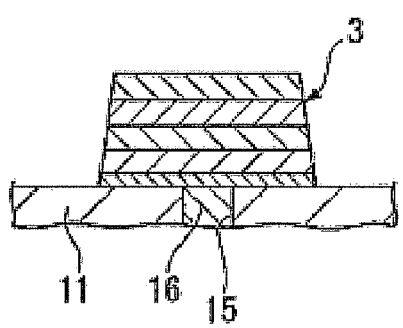
FIGS. 2A-2D are cross-sectional views schematically showing steps of a method for manufacturing a ferroelectric memory device in accordance with an embodiment of the invention.

Next, a ferroelectric capacitor 3 is formed on the first interlayer dielectric film 11 (FIG. 2A). In this step, on the first interlayer dielectric film 11, a film comprised of a constituent material of a conductive film 31, a film comprised of a constituent material of an oxygen barrier film 32, a film comprised of a constituent material of a lower electrode 33, a film comprised of a constituent material of a ferroelectric film 34, and a film comprised of a constituent material of an upper electrode 35 are laminated in layers. These layers are patterned by photolithography technique and the like. By this, the ferroelectric capacitor 3 is formed. In this step, the oxygen barrier film 32 is conductively connected to the plug 16.

Figure 2C:
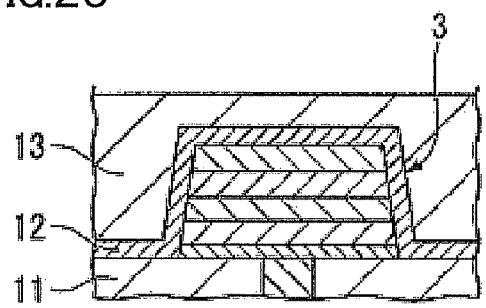
Figure 2B:
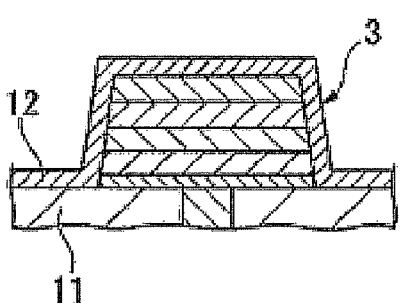

Then, a hydrogen barrier film 12 that covers the ferroelectric capacitor 3 is formed (FIG. 2B). In this step, a film of AlOx is formed by a CVD method in a manner to cover the first interlayer dielectric film 11 and the ferroelectric capacitor 3. It is noted that the AlOx film may be formed by a sputter method, instead of a CVD method.

The ferroelectric film 34 in the ferroelectric capacitor 3 may have oxygen deficiency depending on its film forming condition. Therefore, after the hydrogen barrier film 12 has been formed, a heat treatment in an oxygen atmosphere may be conducted depending on the necessity to supply oxygen in the ferroelectric film 34 through the hydrogen barrier film 12 thereby supplementing the oxygen deficiency. Temperatures for the heat treatment may be, for example, between 550° C. and 750° C., and more preferably between 600° C. and 750° C.

Then, a second interlayer dielectric film 13 that covers the hydrogen barrier film 12 is formed (FIG. 2C). In this step, a film of $SiO_2$ is formed by a plasma CVD method using TEOS (tetraethoxysilane) as the source material (i.e., by a plasma TEOS method), which is a film forming method that could only cause very small damage to the ferroelectric capacitor 3. Then, the top surface of the $SiO_2$ film is planarized by a CMP treatment. It is noted that the $SiO_2$ film may be formed by a sputter method, instead of a plasma TEOS method.

Figure 2D:
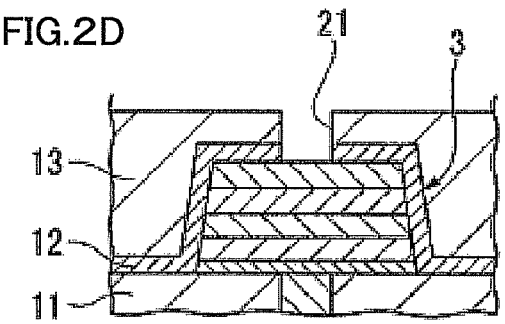

Then, a through hole 21 is formed in the second interlayer dielectric film 13 and in the hydrogen barrier film 12 (FIG. 2D). In this step, a resist layer (not shown) having an opening at a forming region of the through hole 21 is formed on the top surface of the second interlayer dielectric film 13, and the through hole 21 is formed by a dry etching method, using the resist layer as a mask. It is noted that, as an etching apparatus, for example, Alliance 4520XL (manufactured by Lam Research Corporation) may be used.

Table 1 below shows etching rates of the $SiO_2$ film composing the second interlayer dielectric film 13 and etching rates of the AlOx film composing the hydrogen barrier film 12 which were obtained when the gas flow quantity and high frequency bias power were changed in dry etching.

TABLE 1

| | Pressure [mTorr] | High Frequency Power [W] | | Mixed Gas | | | | | Mixing Ratio ($C_4F_8$/ $O_2$) | $C_4F_8$ + $O_2$ [sccm] | Etching Rate [Å/min] | | Ratio of Etching Rates |
|---|---|---|---|---|---|---|---|---|---|---|---|---|---|
| | | | | Flow Quantity [sccm] | | | | | | | | | |
| | | Source | Bias | $C_4F_8$ | $O_2$ | CO | Ar | $N_2$ | | | $SiO_2$ | AlOx | [$SiO_2$/$AlO_x$] |
| Condition 1 | 15 | 1000 | 1000 | 8.5 | 6 | 120 | 160 | 10 | 1.42 | 14.5 | 6110 | 1590 | 3.84 |
| Condition 2 | 15 | 1000 | 1000 | 8.5 | 3 | 120 | 160 | 10 | 2.83 | 11.5 | 4502 | 1785 | 2.52 |
| Condition 3 | 15 | 1000 | 300 | 8.5 | 6 | 120 | 160 | 10 | 1.42 | 14.5 | 3760 | 864 | 4.35 |
| Condition 4 | 15 | 1000 | 300 | 48.5 | 34.2 | 120 | 160 | 10 | 1.42 | 82.7 | 5405 | 834 | 6.48 |

As shown in Table 1, the mixed gas introduced in the chamber at the time of etching is a mixture of $C_4F_8$ gas that is perfluorocarbon gas, $O_2$ gas, CO gas, Ar gas and $N_2$ gas.

As indicated by Condition 1 and Condition 2 in Table 1, as the ratio of $C_4F_8$ gas is lowered with respect to $O_2$ gas and $C_4F_8$ gas, the etching rate of the $SiO_2$ film composing the second interlayer dielectric film 13 becomes relatively higher, compared to the etching rate of the AlOx film composing the hydrogen barrier film 12. Also, as indicated by Condition 1 and Condition 4, as the flow quantity of $C_4F_8$ gas and $O_2$ gas is increased, the etching rate of the $SiO_2$ film becomes relatively higher, compared to the etching rate of the AlOx film. Furthermore, as indicated by Condition 1 and Condition 3, as the high frequency bias power is increased, the etching rate of the $SiO_2$ film becomes relatively higher, compared to the etching rate of the AlOx film. Therefore, in accordance with the present embodiment, Condition 1 is used as the dry etching condition at the time of forming the through hole 21.

When the second interlayer dielectric film 13 and the hydrogen barrier film 12 are etched with Condition 1, the flow quantity of $C_4F_8$ is 0.77 times the flow quantity of $O_2$ or more, such that polymers generated as a result of the resist layer used as a mask at the time of forming the through hole 21 being exposed to plasma are removed. By this, formation of an etching stopper layer formed from polymers within the opening of the resist layer becomes more difficult. Also, by setting the flow quantity of $C_4F_8$ to 3.8 times the flow quantity of $O_2$ gas or lower, the interlayer dielectric film 13 can be etched at a stable rate. Also, a change in the shape of the opening that may be caused by excessive cutting of the resist layer at the time of etching is restricted.

By forming the through hole 21 in a manner described above, a portion of the top surface of the ferroelectric capacitor 3 is exposed. Then, a plug 22 that fills the through hole 21 and a wiring 23 are formed. In this manner, the ferroelectric memory device 1 shown in FIG. 1 is manufactured.

According to the method for manufacturing the ferroelectric memory device 1 in accordance with the present embodiment, the flow quantity of $C_4F_8$ gas is set to 0.77 times the flow quantity of $O_2$ or more, such that formation of an etching stopper layer derived from the resist layer can be suppressed. As a result, the second interlayer dielectric film 13 and the hydrogen barrier film 12 are stably etched, and a sufficient selection ratio can be secured between the hydrogen barrier film 12 and its base layer. Furthermore, the etching gas does not need to be changed between etching of the second interlayer dielectric film 13 and etching of the hydrogen barrier film 12, whereby the manufacturing process can be simplified.

Also, by setting the flow quantity of $C_4F_8$ gas to 3.8 times the flow quantity of $O_2$ or less, the interlayer dielectric film 13 can be etched at a stable rate. Furthermore, a change in the shape of the opening that may be caused by excessive cutting of the resist layer at the time of etching is restricted. Also, the use of $C_4F_8$ gas can prevent generation of oxygen deficiency in the ferroelectric film 34 at the time of forming the through hole 21. Moreover, because the mixed gas contains CO gas, the etching selection ratio of the resist layer can be increased at the time of forming the through hole 21.

It is noted that the invention is not limited to the embodiment described above, and many modifications can be made without departing from the subject matter of the invention. For example, the ferroelectric capacitor may have other structures, such as, for example, a planer type, without being limited to the stacked type structure. Perfluorocarbon gas may be other types of perfluorocarbon gas, such as, for example, $C_4F_6$ gas, $C_5F_8$ gas or the like, without being limited to $C_4F_8$ gas. Moreover, although the flow quantity of $O_2$ gas is set to 2 sccm or greater but 10 sccm or less in accordance with the present embodiment, other values may be used as long as the flow quantity of $C_5F_8$ gas is 0.77 times or more but 3.8 times or less the flow quantity of $O_2$ gas. Furthermore, the mixed gas may have other compositions, as long as the mixed gas contains at least perfluorocarbon gas and oxygen gas, and the mixed gas may not contain carbon monoxide gas when a sufficient etching selection ratio can be obtained with respect to the resist layer.

What is claimed is:

1. A method for manufacturing a ferroelectric memory device, comprising:
    forming a ferroelectric capacitor on a substrate;
    forming a hydrogen barrier film that covers the ferroelectric capacitor;
    forming a dielectric film that covers the hydrogen barrier film; and
    forming a through hole that penetrates the dielectric film and the hydrogen barrier film by etching that uses a mixed gas containing perfluorocarbon gas and oxygen gas,
    wherein a flow quantity of the perfluorocarbon gas is 0.77 times or more but 3.8 times or less of a flow quantity of the oxygen gas.

2. A method for manufacturing a ferroelectric memory device according to claim 1, wherein the flow quantity of oxygen gas is 2 sccm or more but 10 sccm or less.

3. A method for manufacturing a ferroelectric memory device according to claim 1, wherein the mixed gas contains carbon monoxide gas.

* * * * *